United States Patent
Jung et al.

(10) Patent No.: US 10,741,627 B2
(45) Date of Patent: Aug. 11, 2020

(54) ORGANIC LIGHT EMITTING DIODE DISPLAY

(71) Applicant: Samsung Display Co., Ltd., Yongin-si, Gyeonggi-do (KR)

(72) Inventors: Jin-Soo Jung, Hwaseong-si (KR); Hyeok Jin Lee, Seongnam-si (KR); Jun Woo Lee, Seongnam-si (KR); Baek Kyun Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 387 days.

(21) Appl. No.: 15/617,842

(22) Filed: Jun. 8, 2017

(65) Prior Publication Data

US 2018/0033848 A1 Feb. 1, 2018

(30) Foreign Application Priority Data

Aug. 1, 2016 (KR) .................. 10-2016-0098173

(51) Int. Cl.
*H01L 27/32* (2006.01)
*H01L 51/52* (2006.01)
*H01L 51/56* (2006.01)
*H01L 27/12* (2006.01)

(52) U.S. Cl.
CPC ...... *H01L 27/3272* (2013.01); *H01L 27/3246* (2013.01); *H01L 27/3248* (2013.01); *H01L 27/3258* (2013.01); *H01L 27/3262* (2013.01); *H01L 51/5284* (2013.01); *H01L 51/56* (2013.01); *H01L 27/1248* (2013.01); *H01L 51/5237* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 8,253,128 B2* | 8/2012 | Kim | H01L 27/322 257/40 |
| 9,291,846 B2* | 3/2016 | Yoon | G02F 1/133377 |
| 9,525,016 B2* | 12/2016 | Ahn | H01L 27/3272 |
| 9,627,458 B2* | 4/2017 | Kim | H01L 27/3246 |
| 2005/0263775 A1* | 12/2005 | Ikeda | G09G 3/3291 257/79 |
| 2007/0126969 A1* | 6/2007 | Kimura | G02F 1/133555 349/141 |
| 2013/0300775 A1* | 11/2013 | Choi | G02B 26/005 345/690 |
| 2013/0342890 A1* | 12/2013 | Shim | G09G 3/348 359/290 |

(Continued)

FOREIGN PATENT DOCUMENTS

| KR | 10-0712182 | 4/2007 |
|---|---|---|
| KR | 10-0911993 | 8/2009 |

*Primary Examiner* — Walter H Swanson
*Assistant Examiner* — Kien C Ly
(74) *Attorney, Agent, or Firm* — Lewis Roca Rothgerber Christie LLP

(57) ABSTRACT

An organic light emitting diode (OLED) display includes a substrate, a thin film transistor on the substrate, an organic light emitting diode on the thin film transistor, and including a first electrode connected with the thin film transistor, and a black organic layer between the thin film transistor and the first electrode, and including a black protrusion spaced from the first electrode.

9 Claims, 6 Drawing Sheets

(56) References Cited

U.S. PATENT DOCUMENTS

| | | | |
|---|---|---|---|
| 2016/0004135 A1* | 1/2016 | Nakao | G02F 1/13394 |
| | | | 349/42 |
| 2016/0020262 A1 | 1/2016 | Ahn et al. | |
| 2016/0049615 A1* | 2/2016 | Kim | H01L 27/3272 |
| | | | 257/40 |
| 2016/0293682 A1* | 10/2016 | Park | H01L 51/5275 |
| 2017/0053972 A1* | 2/2017 | Kim | H01L 27/3218 |
| 2017/0062535 A1* | 3/2017 | Kim | H01L 51/5284 |
| 2017/0062772 A1* | 3/2017 | Chu | H01L 51/5284 |
| 2017/0125492 A1* | 5/2017 | Kim | H01L 27/3244 |
| 2017/0153519 A1* | 6/2017 | Xu | G02F 1/136227 |
| 2017/0194415 A1* | 7/2017 | Choi | H01L 51/0096 |

\* cited by examiner

ORGANIC LIGHT EMITTING DIODE DISPLAY

CROSS-REFERENCE TO RELATED APPLICATION

This application claims priority to, and the benefit of, Korean Patent Application No. 10-2016-0098173 filed in the Korean Intellectual Property Office on Aug. 1, 2016, the entire contents of which are incorporated herein by reference.

BACKGROUND

1. Field

This disclosure relates to an organic light emitting diode (OLED) display.

2. Description of the Related Art

A display device may include an organic light emitting diode (OLED) display, a liquid crystal display (LCD), and the like.

The OLED display includes a substrate, a thin film transistor on the substrate, a first electrode that is connected with the thin film transistor, a pixel defining layer that has an opening that partially exposes the first electrode, an organic emission layer on the first electrode corresponding to the opening, and a second electrode on the organic emission layer.

In the OLED display, a phase delay plate and a polarizer may be attached on top of the first electrode to suppress reflection of the first electrode or of the thin film transistor otherwise caused due to external light. In addition, when the phase delay plate and the polarizer are omitted, the pixel defining layer of the OLED display may include a black pixel defining layer that includes a pigment of a black color to suppress reflection due to external light.

The above information disclosed in this Background section is only for enhancement of understanding of the background of the described technology, and therefore may contain information that does not form the prior art.

SUMMARY

The described technology provides an OLED display that can suppress reflection due to external light.

In addition, embodiments of the present invention provide an OLED display that can suppress permeation of an off-gas generated from a black organic layer into an organic emission layer.

In one aspect, embodiments of the present invention provide an organic light emitting diode (OLED) display that includes a substrate, a thin film transistor on the substrate, an organic light emitting diode on the thin film transistor, and including a first electrode connected with the thin film transistor, and a black organic layer between the thin film transistor and the first electrode, and including a black protrusion spaced from the first electrode.

A top of the black protrusion may be farther from the substrate than a top of the first electrode.

The OLED display may further include a transparent pixel defining layer on the black organic layer, and defining an opening that overlaps at least a part of the first electrode.

The transparent pixel defining layer may cover the black protrusion.

The organic light emitting diode may further include an organic emission layer on the first electrode, and a second electrode on the organic emission layer, and the transparent pixel defining layer may include a side wall that contacts the organic emission layer and defines the opening.

The black protrusion may be spaced from the organic emission layer.

The transparent pixel defining layer may be between the black protrusion and the organic emission layer.

The black protrusion may surround the first electrode in a plan view.

The black organic layer may contacts a bottom side of the first electrode, and the first electrode may contact the thin film transistor through a hole in the black organic layer.

In another aspect, embodiments of the present invention provide an OLED display that includes a substrate, a thin film transistor on the substrate, an organic light emitting diode on the thin film transistor, and including a first electrode connected with the thin film transistor, and an organic emission layer on the first electrode, an insulation layer between the thin film transistor and the first electrode, a transparent pixel defining layer on the insulation layer, and including a side wall that defines an opening that partially overlaps the first electrode, and that at least partially surrounds and contacts the organic emission layer, and a black organic layer on the transparent pixel defining layer.

The black organic layer may be spaced from the organic emission layer.

The black organic layer may have an area that is smaller than an area of the transparent pixel defining layer.

The black organic layer may surround the first electrode in a plan view.

The insulation layer may have a black color, and contacts a bottom side of the first electrode, and the first electrode may contact the thin film transistor through a hole in the insulation layer.

According to the described embodiments, reflection due to external light can be suppressed in the OLED display.

In addition, off-gas generated from the black organic layer can be reduced or prevented from permeating into the organic emission layer, thereby improving the lifespan of the OLED display.

DETAILED DESCRIPTION

Figure 1:
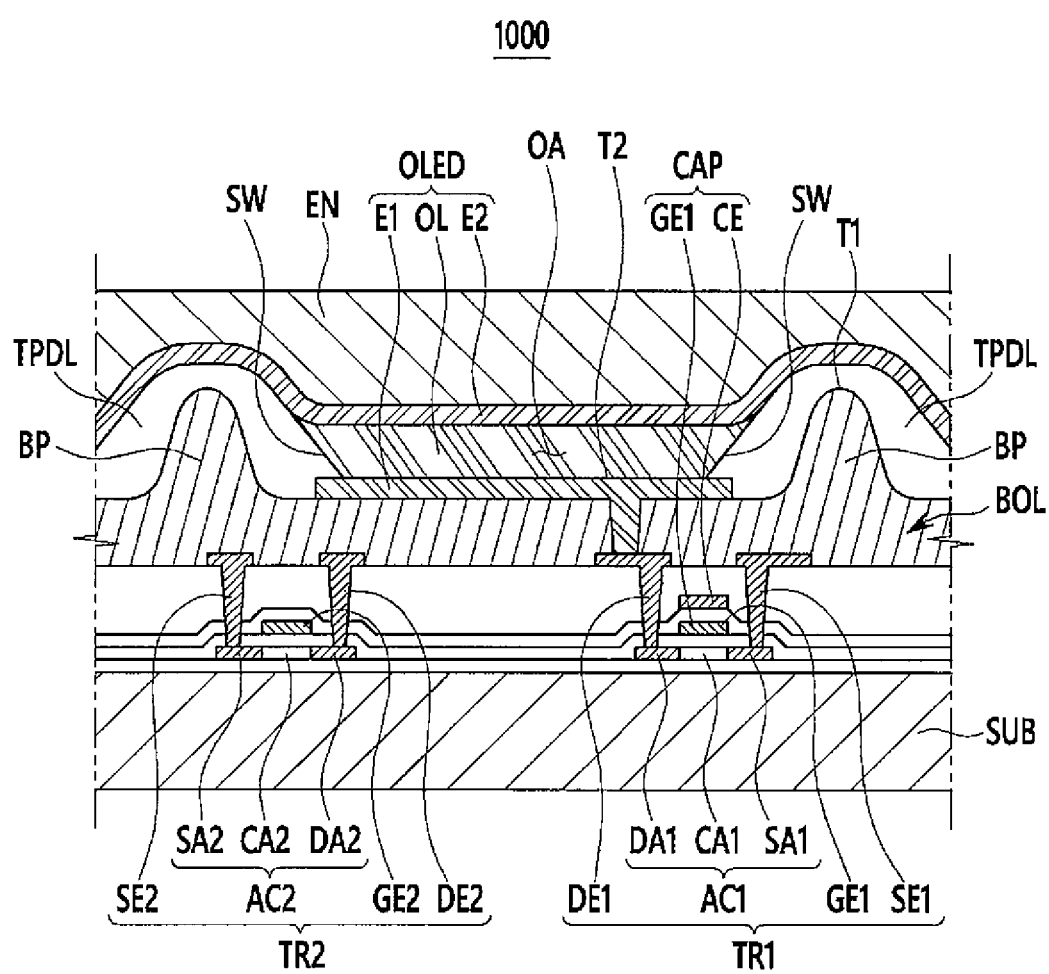
FIG. 1 is a cross-sectional view of an OLED display according to an embodiment.

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, referring to FIG. 1 and FIG. 2, an OLED display according to an embodiment will be described.

FIG. 1 is a cross-sectional view of an OLED display according to an embodiment, and shows a part of the OLED display according to the embodiment.

As shown in FIG. 1, an OLED display 1000 according to an embodiment includes a substrate SUB, a first thin film transistor TR1, a second thin film transistor TR2, a capacitor CAP, an organic light emitting diode OLED, a black organic layer BOL, a transparent pixel defining layer TPDL, and an encapsulation portion EN.

The substrate SUB may include at least one of an organic material, an inorganic material, and/or glass. The substrate SUB may be flexible, stretchable, rollable, and/or foldable.

The first thin film transistor TR1 is provided on the substrate SUB, and includes a first active layer AC1, a first gate electrode GE1, a first source electrode SE1, and a first drain electrode DE1.

The first active layer AC1 includes a first source region SA1, a first channel region CA1, and a first drain region DA1. The first source region SA1 is spaced apart from the first drain region DA1, with the first channel region CA1 being therebetween. The first active layer AC1 may be made of polysilicon or an oxide semiconductor. The first channel region CA1 of the first active layer AC1 may be a channel region doped with an N-type impurity or a P-type impurity, and the first source region SA1 and the first drain region DA1 may be doped with an impurity that is of the opposite type to the impurity with which the first channel region CA1 is doped.

The first gate electrode GE1 is provided on the first channel region CA1 of the first active layer AC1. The first gate electrode GE1 is a gate electrode of the first thin film transistor TR1, and is also one electrode of the capacitor CAP. The first gate electrode GE1 and the capacitor electrode CE form the capacitor CAP.

The first source electrode SE1 is connected with the first source region SA1 of the first active layer AC1 through a contact hole formed in an insulation layer. Here, the insulation layer may be provided as a single layer or a multilayer between the first active layer AC1 and the first gate electrode GE1, between the first gate electrode GE1 and the capacitor electrode CE, and between the capacitor electrode CE and the first source electrode SE1. The insulation layer may include at least one of an organic material and an inorganic material.

The first drain electrode DE1 is connected with the first drain region DA1 of the first active layer AC1 through a contact hole formed in the insulation layer.

The second thin film transistor TR2 is provided on the substrate SUB, and includes a second active layer AC2, a second gate electrode GE2, a second source electrode SE2, and a second drain electrode DE2.

The second active layer AC2 includes a second source region SA2, a second channel region CA2, and a second drain region DA2. The second source region SA2 is spaced apart from the second drain region DA2, with the second channel region CA2 being interposed therebetween. The second active layer AC2 may be made of polysilicon or an oxide semiconductor. The second channel region CA2 of the second active layer AC2 may be doped with an N-type impurity or a P-type impurity, and the second source region SA2 and the second drain region DA2 may be doped with an impurity that is opposite to the impurity with which the second channel region CA2 is doped.

The second gate electrode GE2 is provided on the second channel region CA2 of the second active layer AC2. The second gate electrode GE2 is on the same layer as the first gate electrode GE1 of the first thin film transistor TR1.

The second source electrode SE2 is connected with the source region SA2 of the second active layer AC2 through a contact hole formed in the insulation layer.

The second drain electrode DE2 is connected with the second drain region DA2 of the second active layer AC2 through a contact hole formed in the insulation layer.

The capacitor CAP includes a first electrode and a second electrode that are opposite to each other, and the insulation layer interposed therebetween. The first electrode of the capacitor CAP is a first gate electrode GE1, and the second electrode of the capacitor CAP is a capacitor electrode CE. The capacitor electrode CE is provided on the first gate electrode GE1, with the insulation layer interposed therebetween, and forms the capacitor CAP together with the first gate electrode GE1. The capacitor electrode CE and the first gate electrode GE1 are provided on different layers, respectively, and may include the same material or different materials.

The organic light emitting diode OLED is provided on at least one of the first thin film transistor TR1 and the second thin film transistor TR2, and includes a first electrode E1, an organic emission layer OL, and a second electrode E2.

In the present embodiment, the first electrode E1 is connected with the first drain electrode DE1 of the first thin film transistor TR1. The first electrode E1 is passed through the black organic layer BOL, and then connected with the drain electrode DE1 of the first thin film transistor TR1. The first electrode E1 may be a light reflective electrode or a light semi-permeable electrode.

The organic emission layer OL is provided on the first electrode E1 corresponding to an opening OA of, or defined by, the transparent pixel defining layer TPDL to expose at least a part of the first electrode E1. The organic emission layer OL contacts one or more side walls SW of the transparent pixel defining layer TPDL. The organic emission layer OL is provided between the first electrode E1 and the second electrode E2. The organic emission layer OL may emit light having at least one color of red, blue, green, and white, for example.

The second electrode E2 is provided on the organic emission layer OL. The second electrode E2 is provided on the organic emission layer OL and the transparent pixel defining layer TPDL. The second electrode E2 may be a light transmissive electrode or a light semi-permeable electrode. Light emitted from the organic emission layer OL may be emitted to the outside through the second electrode E2.

The black organic layer BOL is provided between the first electrode E1 and the first thin film transistor TR1. The first electrode E1 is connected with the first thin film transistor TR1 through a contact hole formed in the black organic layer BOL. The black organic layer BOL is provided at a bottom side of the first electrode E1.

The black organic layer BOL has a black color. The black organic layer BOL includes a pigment having a black color or carbon black, a binder for dispersion, a dispersing agent, and/or the like. Because the black organic layer BOL has the black color, external light is absorbed in the black organic layer BOL, and thus the first thin film transistor TR1 and the second thin film transistor TR2 can be prevented from being viewed due to reflection of external light.

The black organic layer BOL also includes a black protrusion BP. The black protrusion BP protrudes from the surface of the black organic layer BOL at a distance from the first electrode E1. The black protrusion BP is integrally provided with the black organic layer BOL. A first top T1 of the black protrusion BP is farther away from the substrate SUB than an upper surface of the first electrode E1, wherein the upper surface of the first electrode E1 may be referred to as a second top T2. That is, a top of the black protrusion BP protrudes to be higher when compared to the upper surface of the first electrode E1 with reference to the substrate SUB (e.g., a top of the black protrusion BP is further from the substrate SUB than a top of the first electrode E1).

Figure 2:
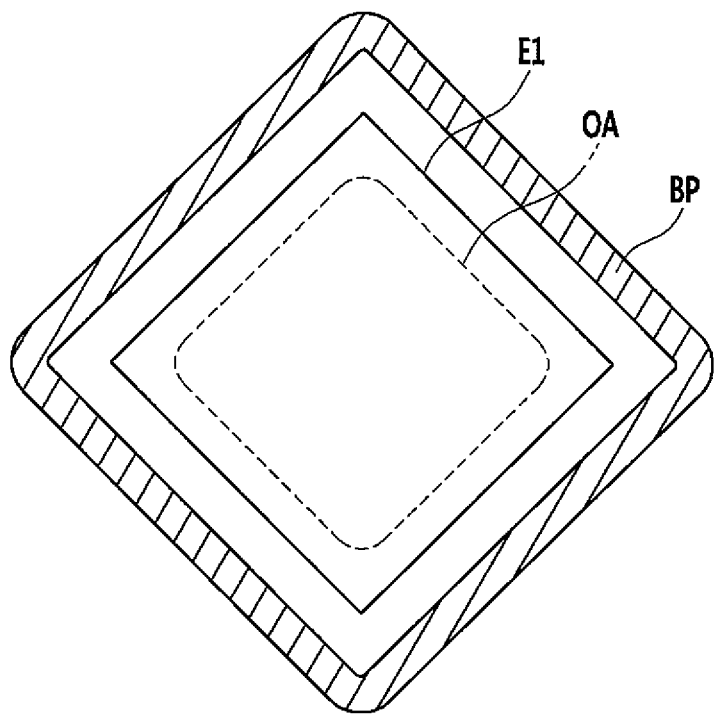
FIG. 2 is a top plan view of a first electrode, an opening, and a black protrusion of FIG. 1.

FIG. 2 is a top plan view of the first electrode, the opening, and the black protrusion shown in FIG. 1. The first electrode, the opening, and the black protrusion are schematically illustrated in FIG. 2 for better understanding and ease of description, but the shape of the first electrode, the shape of the opening, and the shape of the black protrusion according to the present embodiment are not limited to those shown in FIG. 2.

As shown in FIG. 2, the black protrusion BP surrounds the first electrode E1 in a plan view. For example, the black protrusion BP completely surrounds the first electrode E1 in a plan view, and has a closed loop shape. Further, the top of the black protrusion BP protrudes to be higher than the upper surface of the first electrode E1 (e.g., with reference to the substrate SUB). Thus, although external light is reflected by the first electrode E1, light reflected in a direction of the black protrusion BP, from among the reflected light, is absorbed by the black protrusion BP, thereby suppressing external light from being seen. That is, the first electrode E1 can be prevented from being seen due to the reflection of external light.

Referring back to FIG. 1, the black protrusion BP is apart from the organic emission layer OL, and the transparent pixel defining layer TPDL is between the black protrusion BP and the organic emission layer OL.

The transparent pixel defining layer TPDL is on the black organic layer BOL. The transparent pixel defining layer TPDL includes, or defines, an opening OA that overlaps at least a part of the first electrode E1, and also includes a side wall SW that surrounds/defines the opening OA. The opening OA overlaps a center area of the first electrode E1, although such a feature is not restrictive. For example, the opening OA may overlap the entire area of the first electrode E1.

The side wall SW of the transparent pixel defining layer TPDL is between the organic emission layer OL and the black protrusion BP. The side wall SW of the transparent pixel defining layer TPDL contacts the organic emission layer OL.

The transparent pixel defining layer TPDL covers the black protrusion BP of the black organic layer BOL. In the present embodiment, the transparent pixel defining layer TPDL completely covers the black protrusion BP, but this is not restrictive. For example, the transparent pixel defining layer TPDL may partially expose the black protrusion BP.

The encapsulation portion EN is provided on the organic light emitting diode OLED. The encapsulation portion EN encapsulates the organic light emitting diode OLED together with the substrate SUB. The encapsulation portion EN includes a thin film encapsulation layer, which may be provided as a single layer or a multilayer. The encapsulation portion EN may include a substrate.

Figure 3:
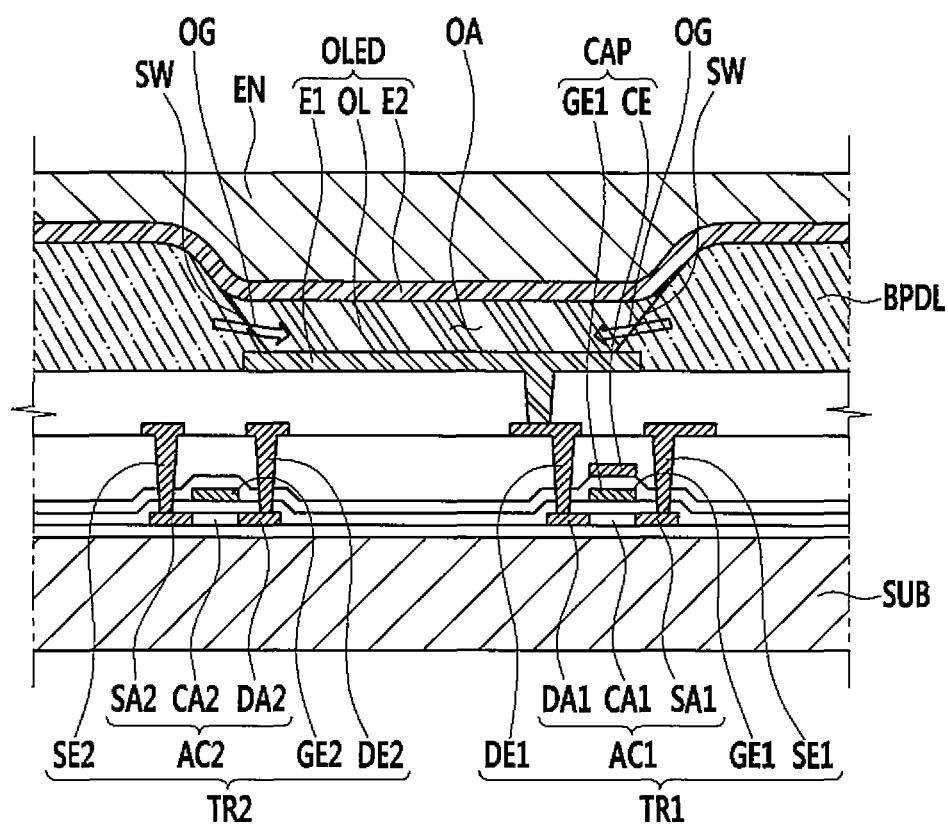
FIG. 3 is a cross-sectional view of a conventional OLED display that includes a black pixel defining layer.

FIG. 3 is a cross-sectional view of a conventional OLED display that includes a black pixel defining layer.

As shown in FIG. 3, a conventional OLED display 10 includes a black pixel defining layer BPDL, and the black pixel defining layer BPDL includes an opening OA that partially exposes a first electrode E1, and that also includes a side wall SW that surrounds the opening OA. The side wall SW of the black pixel defining layer BPDL contacts the organic emission layer OL. The black pixel defining layer BPDL includes a pigment or carbon black, a binder for dispersion, a dispersing agent, and/or the like, and thus, an off-gas OG may be generated from the black pixel defining layer BPDL. The off-gas OG generated from the black pixel defining layer BPDL may be permeated into the organic emission layer OL from the side wall SW of the black pixel defining layer BPDL. The organic emission layer OL may be oxidized due to the off-gas OG permeated from the black pixel defining layer BPDL, and accordingly the lifespan of the organic emission layer OL is shortened. That is, the lifespan of the OLED display 10 may be deteriorated due to the black pixel defining layer BPDL that contacts the organic emission layer OL.

However, in the OLED display 1000 according to the embodiment of FIG. 1 and FIG. 2, the black organic layer BOL that includes the pigment or carbon black, the binder for dispersion, the dispersing agent, and/or the like may be between the first electrode E1 and the first thin film transistor TR1 so that an off-gas generated from the black organic layer BOL can be prevented from being permeated into the organic emission layer OL.

In addition, in the OLED display 1000 according to the above-described embodiment, the black protrusion BP of the black organic layer BOL is apart from the first electrode E1 and the organic emission layer OL, the transparent pixel defining layer TPDL, which does not include a pigment or carbon black, a binder for dispersion, a dispersing agent, and the like, is between the organic emission layer OL and the black protrusion BP, and not the black organic layer BOL but the side wall SW of the transparent pixel defining layer TPDL contacts the organic emission layer OL, so that the off-gas generated from the black protrusion BP can be blocked (e.g., by the transparent pixel defining layer TPDL) to be prevented from permeating into the organic emission layer OL.

That is, because the oxidization of the organic emission layer OL by the off-gas permeated therein from the black organic layer BOL can be reduced or prevented, the lifespan of the organic emission layer OL of the OLED display 1000 can be improved.

As described, in the OLED display 1000 according to the above-described embodiment, the black organic layer(s) BOL(s) that are between the first electrode E1 and the first thin film transistor TR1, and between the first electrode E1 and the second thin film transistor TR2, have a black color so that external light is absorbed in the black organic layer BOL. Accordingly, viewing of the first thin film transistor TR1 and the second thin film transistor TR2 due to reflection of external light can be reduced or prevented.

Further, because the black protrusion BP surrounds the first electrode E1 in a plan view, while the top of the black protrusion BP protrudes higher than the upper surface of the first electrode E1 (with reference to the substrate SUB), even though the external light is reflected by the first electrode E1, light reflected in a direction of the black protrusions BP, among the reflected light, is absorbed in the black protrusion BP such that the light reflected in the direction of the black protrusion BP can be prevented from being viewed from the outside.

In addition, in the OLED display 1000, the black protrusion BP of the black organic layer BOL is apart from the first electrode E1 and the organic emission layer OL. Also, the transparent pixel defining layer TPDL is between the organic emission layer OL and the black protrusion BP, and not the black organic layer BOL. Instead, the side wall SW of the transparent pixel defining layer TPDL contacts the organic emission layer OL. Thus, the off-gas generated from the black protrusion BP can be prevented from permeating into the organic emission layer OL.

That is, even though the black organic layer BOL, which suppresses reflection due to external light, is included, the off-gas generated from the black organic layer BOL is prevented from permeating into the organic emission layer OL, such that the lifespan of the OLED display 1000 can be improved.

Now, referring to FIG. 4, an OLED display according to another embodiment will be described. Hereinafter, a description of a portion of the OLED display that is different from the OLED display according to the above-described embodiment will be provided.

Figure 4:
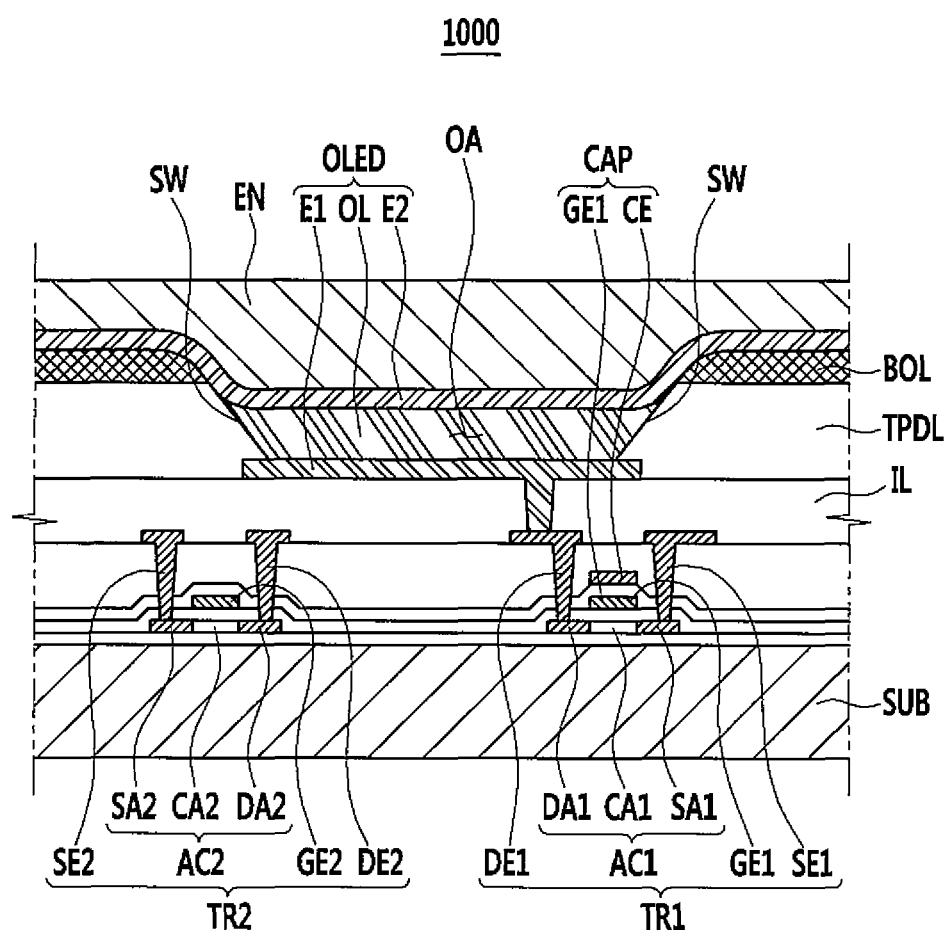
FIG. 4 is a cross-sectional view of an OLED display according to another embodiment.

FIG. 4 is a cross-sectional view of an OLED display according to another embodiment.

As shown in FIG. 4, an OLED display 1000 according to another embodiment includes a substrate SUB, a first thin film transistor TR1, a second thin film transistor TR2, a capacitor CAP, an organic light emitting diode OLED, an insulation layer IL, a transparent pixel defining layer TPDL, a black organic layer BOL, and an encapsulation portion EN.

The insulation layer IL is between a first electrode E1 and the first thin film transistor TR1, and is between the first electrode E1 and the second thin film transistor TR2. The first electrode E1 is connected with the first thin film transistor TR1 through a contact hole formed in the insulation layer IL. The insulation layer IL is provided below the first electrode E1 to contact a bottom side of the first electrode E1.

The insulation layer IL may be provided as a single layer or a multilayer. The insulation layer IL may include at least one of an organic material and an inorganic material.

The transparent pixel defining layer TPDL is provided on the insulation layer IL. The transparent pixel defining layer TPDL includes/defines an opening OA that overlaps at least a part of the first electrode E1, and also includes a side wall SW that surrounds the opening OA. The opening OA overlaps a center area of the first electrode E1, but this is not restrictive. For example, the opening OA may instead overlap the entire area of the first electrode E1.

The black organic layer BOL is provided on the transparent pixel defining layer TPDL. The black organic layer BOL has a black color. The black organic layer BOL includes a pigment having a black color or carbon black, a binder for dispersion, a dispersing agent, and/or the like. Because the black organic layer BOL has the black color, external light that is incident in a direction of the black organic layer BOL, and light that is reflected in a direction of the black organic layer BOL respectively from the first electrode E1, the first thin film transistor TR1, and the second thin film transistor TR2, is absorbed in the black organic layer BOL.

The black organic layer BOL surrounds the first electrode E1 in a plan view (e.g., completely surrounds the first electrode E1 in a plan view), and has a closed loop shape.

As described, the black organic layer BOL surrounds the first electrode E1 in a plan view, and at the same time, the black organic layer BOL is on top of the transparent pixel defining layer TPDL. Thus, although external light is reflected by the first electrode E1, the first thin film transistor TR1, and the second thin film transistor TR2, respectively, light reflected in a direction of the black organic emission BOL is absorbed in the black organic emission BOL, thereby reducing or suppressing external light from being viewed. That is, the first electrode E1, the first thin film transistor TR1, and the second thin film transistor TR2 can be prevented from being viewed due to reflection of external light.

The side wall SW of the transparent pixel defining layer TPDL contacts the organic emission layer OL, and the black organic layer BOL is apart from the organic emission layer OL.

As described, the black organic layer BOL including the pigment or carbon black, the binder for dispersion, the dispersing agent, and/or the like is spaced from the organic emission layer OL, and the side wall SW of the transparent pixel defining layer TPDL, which does not include the pigment or carbon black, the binder for dispersion, the dispersing agent, and the like, contacts the organic emission layer OL. Thus, off-gas generated from the black organic layer BOL can be prevented from permeating into the organic emission layer OL (e.g., can be blocked by the transparent pixel defining layer TPDL).

That is, because oxidization of the organic emission layer OL otherwise caused the off-gas generated from the black organic layer BOL can be reduced or prevented, the lifespan of the organic emission layer OL can be improved.

As described, in the OLED display 1000 according to the present embodiment, the black organic layer BOL that has the black color is on the transparent pixel defining layer TPDL, and thus external light that is incident in a direction of the black organic layer BOL, along with light that is reflected in the direction of the black organic layer BOL from the first electrode E1, from the first thin film transistor TR1, and from the second thin film transistor TR2, respectively, is absorbed in the black organic layer BOL. That is, viewing of the first electrode E1, the first thin film transistor TR1, and the second thin film transistor TR2 due to external light can be reduced or prevented.

In addition, because the black organic layer BOL is apart from the organic emission layer OL, and because the side wall SW of the transparent pixel defining layer TPDL contacts the organic emission layer OL, the off-gas generated from the black organic layer BOL can be prevented from permeating into the organic emission layer OL. That is, even though the black organic layer BOL that suppresses reflection due to external light is included, the off-gas generated from the black organic layer BOL is prevented from permeating into the organic emission layer OL, thereby improving the lifespan of the OLED display 1000.

Now, referring to FIG. 5, an OLED display according to another embodiment will be described. Hereinafter, a description of a portion that is different from the OLED display according to the above-described embodiment will be provided.

Figure 5:
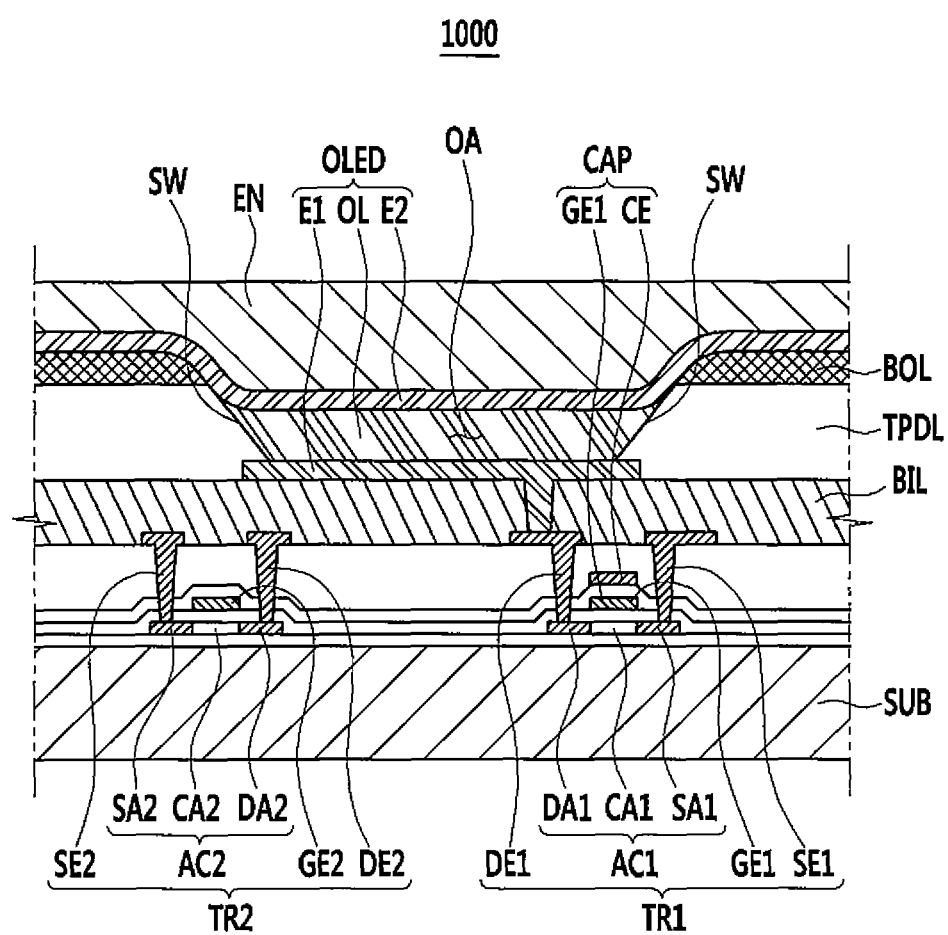
FIG. 5 is a cross-sectional view of an OLED display according to another embodiment.

FIG. 5 is a cross-sectional view of an OLED display according to another embodiment.

As shown in FIG. 5, an OLED display 1000 according to another embodiment includes a substrate SUB, a first thin film transistor TR1, a second thin film transistor TR2, a capacitor CAP, an organic light emitting diode OLED, an insulation layer (e.g., black insulation layer) BIL, a transparent pixel defining layer TPDL, a black organic layer BOL, and an encapsulation portion EN.

The insulation layer BIL is between a first electrode E1 and the first thin film transistor TR1, and is also between the first electrode E1 and the second thin film transistor TR2. The first electrode E1 is connected with the first thin film transistor TR1 through a contact hole formed in the insulation layer BIL. The insulation layer BIL is provided below the first electrode E1 to contact a bottom side of the first electrode E1.

The insulation layer BIL may be provided as a single layer or a multilayer. The insulation layer BIL may include at least one of an organic material and an inorganic material. The insulation layer BIL contacts the bottom side of the first electrode E1, and the first electrode E1 is connected with the first thin film transistor TR1 through the insulation layer BIL.

The insulation layer BIL includes a pigment or carbon black, a binder for dispersion, a dispersing agent, and/or the like. Because the insulation layer BIL has the black color, external light is absorbed in the insulation layer BIL, and thus the first thin film transistor TR1 and the second thin film transistor TR2 can be prevented from being otherwise visible due to reflection of external light.

The transparent pixel defining layer TPDL is provided on the insulation layer BIL. The transparent pixel defining layer TPDL includes an opening OA that overlaps at least a part of the first electrode E1, and includes a side wall SW that surrounds the opening OA. The opening OA overlaps a center area of the first electrode E1, but this is not restrictive. The opening OA may overlap the entire area of the first electrode E1.

The black organic layer BOL is provided on the transparent pixel defining layer TPDL. The black organic layer BOL has a black color. The black organic layer BOL includes a pigment having a black color or carbon black, a binder for dispersion, a dispersing agent, and/or the like. Because the black organic layer BOL has the black color, external light that is incident in a direction of the black organic layer BOL, and light that is reflected in the direction of the black organic layer BOL from the first electrode E1, the first thin film transistor TR1, and the second thin film transistor TR2, respectively, is absorbed in the black organic layer BOL.

The black organic layer BOL surrounds the first electrode E1 in a plan view (e.g., completely surrounds the first electrode E1 in a plan view), and may have a closed loop shape.

As described, the black organic layer BOL surrounds the first electrode E1 in a plan view, and at the same time the black organic layer BOL is on the top of the transparent pixel defining layer TPDL. Thus, although external light is reflected by the first electrode E1, the first thin film transistor TR1, and the second thin film transistor TR2, respectively, light reflected in a direction of the black organic emission BOL, from among the reflected light, is absorbed in the black organic emission BOL, thereby suppressing external light from being viewed. That is, the first electrode E1, the first thin film transistor TR1, and the second thin film transistor TR2 can be prevented from being visible by reducing reflection of external light.

The side wall SW of the transparent pixel defining layer TPDL contacts the organic emission layer OL, and the black organic layer BOL is spaced apart from the organic emission layer OL.

As described, the black organic layer BOL including the pigment or carbon black, the binder for dispersion, the dispersing agent, and/or the like is spaced from the organic emission layer OL, while the side wall SW of the transparent pixel defining layer TPDL, which does not include the pigment or carbon black, the binder for dispersion, the dispersing agent, and the like, contacts the organic emission layer OL. Thus, off-gas generated from the black organic layer BOL can be reduced or prevented from permeating into the organic emission layer OL.

That is, because oxidization of the organic emission layer OL otherwise caused by the off-gas generated from the black organic layer BOL can be reduced or prevented, the lifespan of the organic emission layer OL can be improved.

In addition, in the OLED display according to the present embodiment, the insulation layer BIL that is provided between the first electrode E1 and the first thin film transistor TR1, and also provided between the first electrode E1 and the second thin film transistor TR2, has the black color. Thus, external light is absorbed in the insulation layer BIL so that the first thin film transistor TR1 and the second thin film transistor TR2 can be prevented from being viewed due to reflection of external light.

In addition, in the OLED display 1000 according to the present embodiment, the black organic layer BOL that has the black color is on the transparent pixel defining layer TPDL, and thus external light incident in a direction of the black organic layer BOL, and light reflected in the direction of the black organic layer BOL from the first electrode E1, from the first thin film transistor TR1, and from the second thin film transistor TR2, respectively, is absorbed in the black organic layer BOL. That is, visibility of the first electrode E1, the first thin film transistor TR1, and the second thin film transistor TR2 due to external light can be prevented.

In addition, because the black organic layer BOL is apart from the organic emission layer OL, and because the side wall SW of the transparent pixel defining layer TPDL contacts the organic emission layer OL, the off-gas generated from the black organic layer BOL can be prevented from permeating into the organic emission layer OL. That is, although the insulation layer BIL and the black organic layer BOL that suppress reflection due to external light are included, the off-gas generated from the black organic layer BOL is prevented from permeating into the organic emission layer OL, thereby improving the lifespan of the OLED display 1000.

Now, referring to FIG. 6, an OLED display according to another embodiment will be described. Hereinafter, a description of a portion that is different from the OLED display according to the above-described embodiment will be provided.

Figure 6:
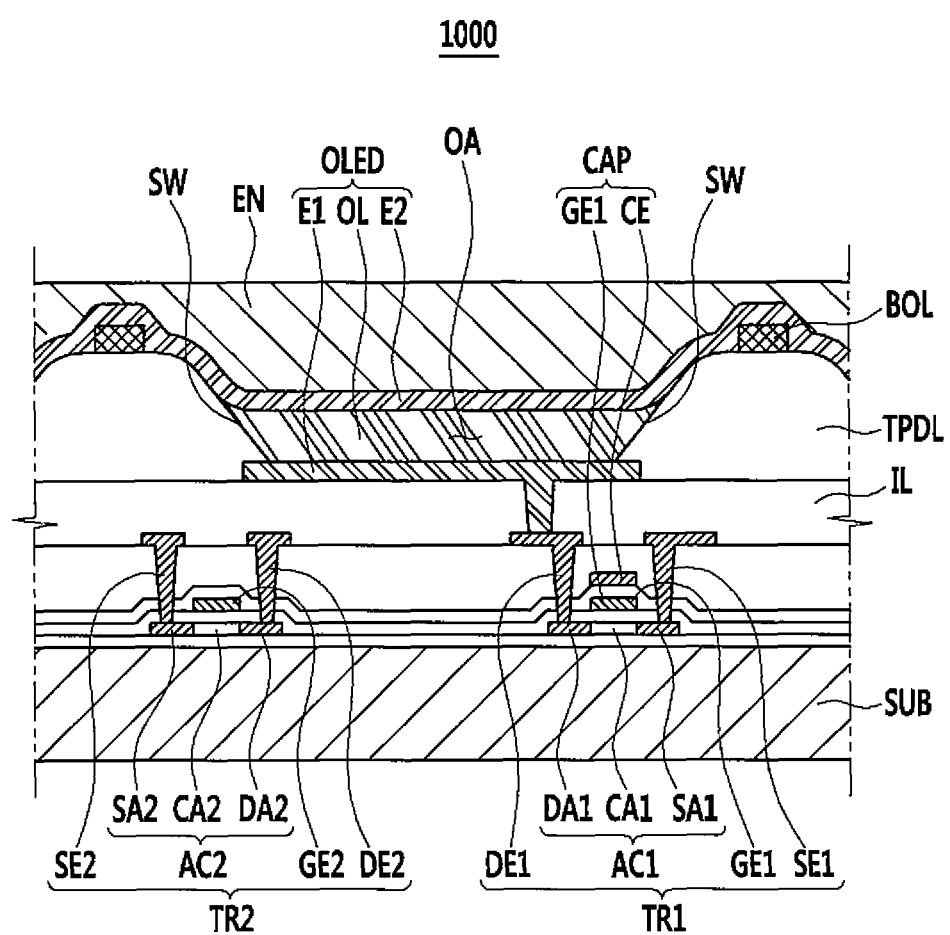
FIG. 6 is a cross-sectional view of an OLED display according to another embodiment.

FIG. 6 is a cross-sectional view of an OLED display according to another embodiment.

As shown in FIG. 6, an OLED display 1000 according to another embodiment includes a substrate SUB, a first thin film transistor TR1, a second thin film transistor TR2, a capacitor CAP, an organic light emitting diode OLED, an insulation layer IL, a transparent pixel defining layer TPDL, a black organic layer BOL, and an encapsulation portion EN.

The insulation layer IL is provided between a first electrode E1 and the first thin film transistor TR1, and is also provided between the first electrode E1 and the second thin film transistor TR2. The first electrode E1 is connected with the first thin film transistor TR1 through a contact hole formed in the insulation layer IL. The insulation layer IL is provided in a bottom side of the first electrode E1.

The insulation layer IL may be provided as a single layer or a multilayer. The insulation layer IL may include at least one of an organic material and an inorganic material.

The transparent pixel defining layer TPDL is provided on the insulation layer IL. The transparent pixel defining layer TPDL includes an opening OA that overlaps at least a part of the first electrode E1, and a side wall SW that surrounds the opening OA. The opening OA overlaps a center area of the first electrode E1, but this is not restrictive. For example, the opening OA may overlap the entire area of the first electrode E1.

The black organic layer BOL is provided on the transparent pixel defining layer TPDL. The black organic layer BOL has a black color. The black organic layer BOL includes a pigment having a black color or carbon black, a binder for dispersion, a dispersing agent, and/or the like. Because the black organic layer BOL has the black color, external light incident in a direction of the black organic layer BOL, and light reflected in a direction of the black organic layer BOL respectively from the first electrode E1, from the first thin film transistor TR1, and from the second thin film transistor TR2, is absorbed in the black organic layer BOL.

The black organic layer BOL surrounds the first electrode E1 in a plan view (e.g., completely surrounds the first electrode E1 in a plan view), and has a closed loop shape.

The black organic layer BOL has a narrow area (e.g., a narrow width in a plan view) compared to the transparent pixel defining layer TPDL. The area of the black organic layer BOL is smaller than a top area of the transparent pixel defining layer TPDL.

Additionally, the black organic layer BOL may be a spacer that supports a mask that is used in a deposition process of the organic emission layer OL during a manufacturing process of the OLED display 1000 (e.g., the mask may be placed on the black organic layer BOL during a deposition process).

As described, the black organic layer BOL surrounds the first electrode E1 in a plan view, and at the same time, the black organic layer BOL is on the top of the transparent pixel defining layer TPDL. Thus, although external light is reflected by the first electrode E1, the first thin film transistor TR1, and the second thin film transistor TR2, respectively, light reflected in a direction of the black organic emission BOL among the reflected light is absorbed in the black organic emission BOL, thereby suppressing external light from being viewed. That is, the first electrode E1, the first thin film transistor TR1, and the second thin film transistor TR2 can be prevented from being viewed due to reflection of external light.

The side wall SW of the transparent pixel defining layer TPDL contacts the organic emission layer OL, and the black organic layer BOL is apart from the organic emission layer OL.

As described, the black organic layer BOL including the pigment or carbon black, the binder for dispersion, the dispersing agent, and/or the like is apart from the organic emission layer OL, while the side wall SW of the transparent pixel defining layer TPDL, which does not include the pigment or carbon black, the binder for dispersion, the dispersing agent, and the like, contacts the organic emission layer OL, and thus off-gas generated from the black organic layer BOL can be prevented from permeating into the organic emission layer OL.

That is, because oxidization of the organic emission layer OL due to the off-gas generated from the black organic layer BOL can be prevented, the lifespan of the organic emission layer OL can be improved.

As described, in the OLED display 1000 according to the present embodiment, the black organic layer BOL that has the black color is on the transparent pixel defining layer TPDL, and thus external light incident in a direction of the black organic layer BOL and light reflected in the direction of the black organic layer BOL from the first electrode E1, the first thin film transistor TR1, and the second thin film transistor TR2, respectively, is absorbed in the black organic layer BOL. That is, viewing of the first electrode E1, the first thin film transistor TR1, and the second thin film transistor TR2 due to external light can be prevented.

That is, although the black organic layer BOL that suppresses reflection due to external light is included in the OLED display 1000, the off-gas generated from the black organic layer BOL is prevented from permeating into the organic emission layer OL, thereby improving the lifespan of the OLED display 1000.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
   a substrate;
   a thin film transistor on the substrate;
   an organic light emitting diode on the thin film transistor, and including a first electrode connected with the thin film transistor; and
   a black organic layer between the thin film transistor and the first electrode, and comprising a black protrusion spaced from the first electrode,
   wherein the black protrusion protrudes from a surface of the black organic layer.

2. The OLED display of claim 1, wherein a top of the black protrusion is farther from the substrate than a top of the first electrode.

3. The OLED display of claim 1, further comprising a transparent pixel defining layer on the black organic layer, and defining an opening that overlaps at least a part of the first electrode.

4. The OLED display of claim 3, wherein the transparent pixel defining layer covers the black protrusion.

5. The OLED display of claim 3, wherein the organic light emitting diode further comprises:
   an organic emission layer on the first electrode; and
   a second electrode on the organic emission layer, and
   wherein the transparent pixel defining layer comprises a side wall that contacts the organic emission layer and defines the opening.

6. The OLED display of claim 5, wherein the black protrusion is spaced from the organic emission layer.

7. The OLED display of claim 5, wherein the transparent pixel defining layer is between the black protrusion and the organic emission layer.

8. The OLED display of claim 1, wherein the black protrusion surrounds the first electrode in a plan view.

9. The OLED display of claim 1, wherein the black organic layer contacts a bottom side of the first electrode, and
   wherein the first electrode contacts the thin film transistor through a hole in the black organic layer.

* * * * *